(12) United States Patent
Hoshi et al.

(10) Patent No.: US 7,909,930 B2
(45) Date of Patent: Mar. 22, 2011

(54) METHOD FOR PRODUCING A SILICON SINGLE CRYSTAL AND A SILICON SINGLE CRYSTAL

(75) Inventors: Ryoji Hoshi, Fukushima (JP); Naoki Nagai, Fukushima (JP); Izumi Fusegawa, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 1177 days.

(21) Appl. No.: 11/587,061

(22) PCT Filed: Mar. 31, 2005

(86) PCT No.: PCT/JP2005/006254
§ 371 (c)(1),
(2), (4) Date: Oct. 20, 2006

(87) PCT Pub. No.: WO2005/108655
PCT Pub. Date: Nov. 17, 2005

(65) Prior Publication Data
US 2007/0266930 A1 Nov. 22, 2007

(30) Foreign Application Priority Data

May 10, 2004 (JP) .................................. 2004-140032

(51) Int. Cl.
*C30B 15/04* (2006.01)
(52) U.S. Cl. ................ 117/19; 117/11; 117/13; 117/21; 117/928; 117/931; 117/932
(58) Field of Classification Search ............ 117/11, 117/13, 19, 21, 928, 931, 932
See application file for complete search history.

(56) References Cited

U.S. PATENT DOCUMENTS

2003/0106482 A1    6/2003   Kononchuk et al.

FOREIGN PATENT DOCUMENTS

| EP | 1 229 155 A1 | 8/2002 |
|---|---|---|
| JP | A 5-201790 | 8/1993 |
| JP | A 5-294780 | 11/1993 |
| JP | A 11-199380 | 7/1999 |
| JP | A 11-302099 | 11/1999 |
| JP | A 11-312683 | 11/1999 |

(Continued)

OTHER PUBLICATIONS

European Search Report issued in corresponding European Application No. 05 72 7712, forwarded Dec. 11, 2009.

(Continued)

*Primary Examiner* — Matthew J Song
(74) *Attorney, Agent, or Firm* — Oliff & Berridge, PLC

(57) ABSTRACT

A method for producing a silicon single crystal by the Czochralski method with carbon-doping comprising: charging a polycrystalline silicon material and any one of a carbon dopant selected from the group consisting of an organic compound, an organic compound and a silicon wafer, carbon powder and a silicon wafer, an organic compound and carbon powder, and an organic compound and carbon powder and a silicon wafer into a crucible and melting the polycrystalline silicon material and the carbon dopant; and then growing a silicon single crystal from the melt of the polycrystalline silicon material and the carbon dopant. And a carbon-doped silicon single crystal produced by the method. Thereby, there is provided a method for producing a silicon single crystal with carbon-doping in which the crystal can be doped with carbon easily at low cost, and carbon concentration in the crystal can be controlled precisely.

16 Claims, 2 Drawing Sheets

| | FOREIGN PATENT DOCUMENTS | |
|---|---|---|
| JP | A 2000-319087 | 11/2000 |
| JP | A 2001-199794 | 7/2001 |
| JP | A 2001-274166 | 10/2001 |
| JP | A-2002-173395 | 6/2002 |
| JP | A 2002-293691 | 10/2002 |
| JP | 2003-146796 | 5/2003 |
| WO | WO 01/79593 A1 | 10/2001 |

OTHER PUBLICATIONS

Official Communication in European Patent Application No. 05 727 712.1 mailed Jun. 28, 2010.
European Office Action mailed Dec, 27, 2010 in related European Patent Application No. 05 727 712.1.

METHOD FOR PRODUCING A SILICON SINGLE CRYSTAL AND A SILICON SINGLE CRYSTAL

TECHNICAL FIELD

The present invention relates to a method for producing a silicon single crystal from which a silicon wafer, used as a substrate of a semiconductor device such as memory or CPU, is sliced and, more particularly, to a method for producing a silicon single crystal and a silicon single crystal used in front-end technology in which crystal defects and density of BMD for gettering impurities are controlled by carbon-doping.

BACKGROUND ART

A silicon single crystal is produced mainly by the Czochralski method (Hereinafter, the Czochralski method is abbreviated to the CZ method). A silicon wafer is sliced from the silicon single crystal, and is used as a substrate of a semiconductor device such as memory or CPU.

A silicon single crystal produced by the CZ method contains oxygen atoms. When a device is fabricated by using a silicon wafer sliced from the silicon single crystal, a silicon atom and oxygen atoms are bonded together to form oxide precipitates (Bulk Micro Defect; Hereinafter, it is abbreviated to BMD). It has been recognized that the BMD has the IG (Intrinsic Gettering) capability to catch contamination atoms such as heavy metal in a wafer and to improve device characteristics. Higher concentration of BMD in the bulk of a wafer provides a higher performance device.

In recent years, to control crystal defects in a silicon wafer and also to impart the IG capability sufficiently, a silicon single crystal has been produced with intentional carbon-doping or nitrogen-doping.

As for a method for doping a silicon single crystal with carbon, gas doping (See Japanese Unexamined Patent Application Publication No. H11-302099), use of high purity carbon powder (See Japanese Unexamined Patent Application Publication No. 2002-293691), use of carbon blocks (See Japanese Unexamined Patent Application Publication No. 2003-146796), and so on have been suggested. However, the above methods have problems, respectively. As for the gas doping, remelting a crystal is impossible when the crystal is dislocated. As for the use of high purity carbon powder, introduced gas scatters the high purity carbon powder at the time of melting material. As for the use of carbon blocks, carbon is hard to melt and a crystal being grown is dislocated.

To overcome these problems, Japanese Unexamined Patent Application Publication No. H11-312683 suggests a method to dope a silicon single crystal with carbon by putting a polycrystalline silicon container containing carbon powder, a silicon wafer on which a carbon film is vapor-deposited, a silicon wafer on which an organic solvent containing carbon particles is applied and baked, or polycrystalline silicon with a certain content of carbon in a crucible. Use of these methods overcomes the problems. However, every method requires a process of polycrystalline silicon, a heat treatment of a wafer, and so on. Consequently, it is not easy to prepare a carbon dopant. Furthermore, the process or the heat treatment of a wafer for preparing the carbon dopant can cause contamination by impurities.

Furthermore, Japanese Unexamined Patent Application Publication No. 2001-199794 and International Publication No. 01/79593 disclose a method for obtaining a silicon single crystal with few grown-in defects and with high IG capability by doping the crystal with carbon and nitrogen together.

Doping a silicon single crystal with nitrogen is conducted commonly by mixing a wafer on the surface of which a silicon nitride film is formed into a polycrystalline material (see Japanese Unexamined Patent Application Publication No. H05-294780). However, such methods cannot overcome the above problems in carbon-doping.

DISCLOSURE OF THE INVENTION

The present invention is accomplished in view of the aforementioned problems, and its object is to provide a method for producing a silicon single crystal with carbon-doping in which the crystal can be doped with carbon easily at low cost, and carbon concentration in the crystal can be controlled precisely.

In order to achieve the aforementioned object, according to the present invention, there is provided a method for producing a silicon single crystal by the Czochralski method with carbon-doping comprising: charging a polycrystalline silicon material and any one of a carbon dopant selected from the group consisting of an organic compound, an organic compound and a silicon wafer, carbon powder and a silicon wafer, an organic compound and carbon powder, and an organic compound and carbon powder and a silicon wafer into a crucible and melting the polycrystalline silicon material and the carbon dopant; and then growing a silicon single crystal from the melt of the polycrystalline silicon material and the carbon dopant.

As mentioned above, a polycrystalline silicon material and any one of a carbon dopant selected from the group consisting of an organic compound, an organic compound and a silicon wafer, carbon powder and a silicon wafer, an organic compound and carbon powder, and an organic compound and carbon powder and a silicon wafer are charged into a crucible. And the polycrystalline silicon material and the carbon dopant are melted. After that, a silicon single crystal is grown from the melt of the polycrystalline silicon material and the carbon dopant. As a result, a silicon single crystal can be doped with carbon easily and precisely.

In the above case, it is preferable that the carbon dopant selected from the group consisting of the organic compound and the silicon wafer, the carbon powder and the silicon wafer, and the organic compound and the carbon powder and the silicon wafer is charged into the crucible with sandwiching the organic compound and/or the carbon powder between a plurality of the silicon wafers.

In this way, as to the carbon dopant selected from the group consisting of the organic compound and the silicon wafer, the carbon powder and the silicon wafer, and the organic compound and the carbon powder and the silicon wafer, when the organic compound and/or the carbon powder is sandwiched between a plurality of the silicon wafers, the organic compound and the carbon powder are put between the silicon wafers. Furthermore, in the case of using the organic compound and the silicon wafer, the organic compound adheres to the silicon wafer at the time of melting material. Consequently, material melt is more certainly doped with elements of the organic compound. In addition, in the case of using the carbon powder, it can be prevented that an introduced inert gas such as argon gas scatters the carbon powder at the time of melting material. Therefore, it becomes possible to control carbon concentration in the material melt to be a desired concentration.

Moreover, it is preferable that the carbon dopant selected from the group consisting of the organic compound and the carbon powder, and the organic compound and the carbon powder and the silicon wafer is charged into the crucible with containing the carbon powder in a bag made of the organic compound.

In this manner, charging the carbon dopant selected from the group consisting of the organic compound and the carbon powder, and the organic compound and the carbon powder and the silicon wafer into the crucible with containing the carbon powder in a bag made of the organic compound produces effects such as preventing scattering of the carbon powder by an inert gas at the time of melting material. Accordingly, the material melt is certainly doped with carbon. Furthermore, it is more preferable to charge the carbon dopant with sandwiching the bag between the silicon wafers.

In the above cases, it is preferable that main elements of the organic compound consist of carbon and hydrogen, or carbon and hydrogen and oxygen.

In this manner, a silicon crystal can be doped with carbon by the use of the organic compound in which main elements consist of carbon and hydrogen, or carbon and hydrogen and oxygen. And, the elements except carbon have an advantage that such elements do not become impurities having harmful effects to silicon characteristics even when the elements are melted into a silicon single crystal.

Furthermore, the organic compound may include carbon and nitrogen as main elements.

In this way, by using the organic compound including nitrogen as a main element, a silicon single crystal can be doped with nitrogen in addition to carbon.

Any one or more of polyethylene, vinyl polymer and nylon can be used as the organic compound.

Use of polyethylene, vinyl polymer and nylon enables carbon-doping at low cost because such materials are inexpensive.

The present invention also provides a carbon-doped silicon single crystal produced by the method for producing a silicon single crystal according to the present invention.

The method for producing a silicon single crystal according to the present invention provides a carbon-doped silicon single crystal with a desired carbon concentration.

As described above, the present invention overcomes the problems that an inert gas scatters a carbon dopant at the time of melting material, and so on. Consequently, carbon concentration in a silicon single crystal can be controlled to be a target value precisely, and a carbon-doped silicon single crystal can be produced easily at low cost. Furthermore, the present invention enables doping of carbon and nitrogen together. Such a carbon- and nitrogen-doping provides excellent control of carbon- and nitrogen concentration, and can be carried out with extreme ease at low cost.

BEST MODE FOR CARRYING OUT THE INVENTION

Figure 1:
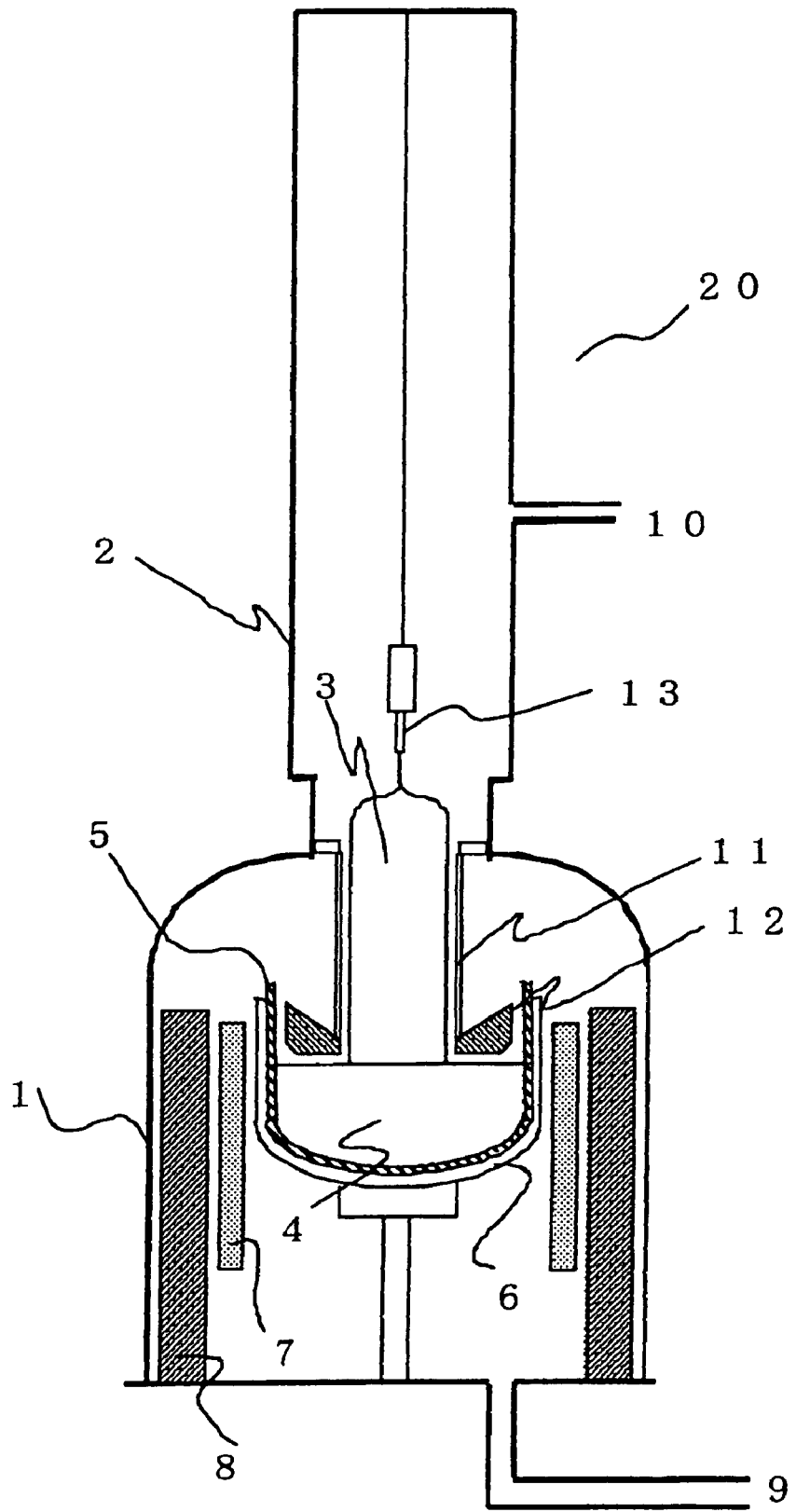
FIG. 1 is a schematic view of an example of an apparatus for producing a silicon single crystal used in the method for producing a carbon-doped silicon single crystal according to the present invention.

Hereinafter, an embodiment of the present invention will be explained with referring to the drawings. However, the present invention is not limited thereto.

FIG. 1 shows an example of an apparatus for pulling a single crystal used in carrying out a method for producing a carbon-doped silicon single crystal according to the present invention. In a main chamber 1 of an apparatus 20 for pulling a single crystal, a quartz crucible 5 and a graphite crucible 6 are provided. The quartz crucible 5 contains a melted material melt 4. The graphite crucible 6 supports the quartz crucible 5. The graphite crucible 6 is surrounded by a heater 7. Further, insulating material 8 surrounds the outside of the heater 7. Further, over the material melt 4, a gas flow-guide cylinder 11 and a heat insulating component 12 are provided to surround a silicon single crystal 3.

Into the quartz crucible, polycrystalline silicon and a carbon dopant, which are materials for a carbon-doped silicon single crystal according to the present invention, are charged. At this time, a dopant for controlling resistivity of a substrate such as phosphorus or boron is added. The carbon dopant used in the present invention is any one selected from the group consisting of an organic compound; an organic compound and a silicon wafer; carbon powder and a silicon wafer; an organic compound and carbon powder; and an organic compound and carbon powder and a silicon wafer. As for the organic compound, a compound having main elements of carbon and hydrogen, or carbon and hydrogen and oxygen such as polyethylene or vinyl polymer is used. Use of such an organic compound has a great advantage of not causing problems in growing a single crystal. Because even when the elements except carbon are melted into the material melt, the elements do not become impurities that have harmful effects to silicon characteristics; or the elements except carbon turns into gas and fly off at the time of melting the material. Furthermore, such organic compounds are inexpensive, and the compounds with high purity are easily available. Consequently, it is possible to calculate a doped amount of carbon in silicon based on an amount, composition, and so on of the doped organic compound. By the way, the carbon powder is not particularly limited by purity or grain size. However, carbon powder with high purity is preferably used because use of the powder reduces generation of defects such as OSF due to impurities contained in the carbon powder. Incidentally, the carbon powder with high purity is, for example, carbon powder with purity of 99.99% or more and with ash content of 0.01% or less.

Figure 2:
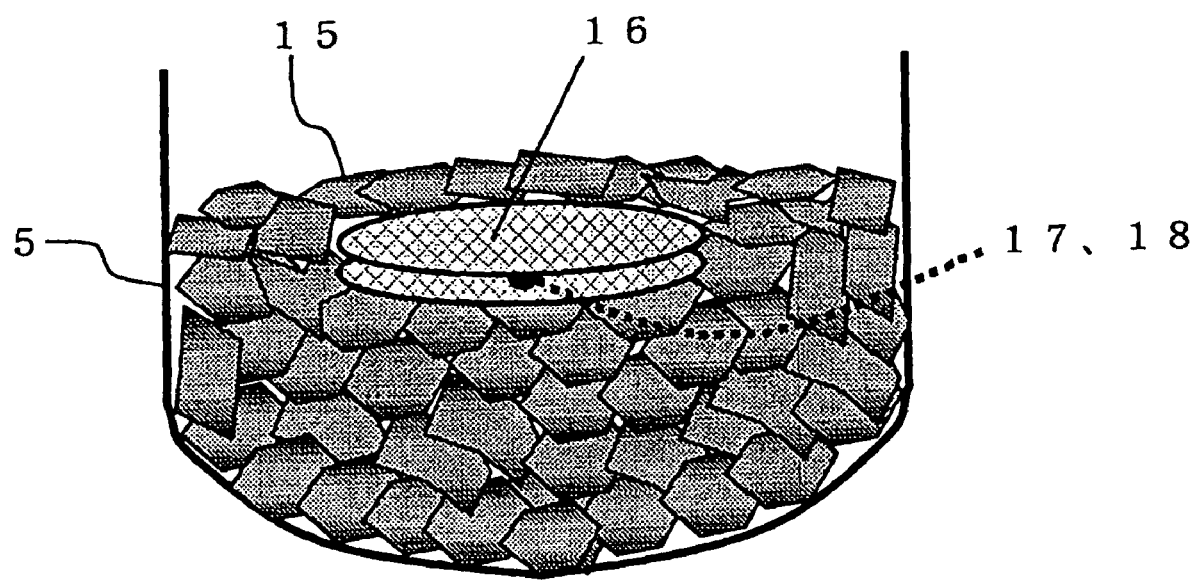
FIG. 2 is a schematic diagram of a state that materials of a silicon single crystal according to the present invention is charged in a quartz crucible.

For example, as shown in FIG. 2, the carbon dopant is preferably charged together with polycrystalline silicon 15 into the quartz crucible 5 with sandwiching the organic compound 17 and/or the carbon powder 18 between a plurality of the silicon wafers 16. FIG. 2 shows an example of sandwiching with two silicon wafers. However, more wafers may be used in accordance with an amount of the organic compound 17 or the carbon powder 18.

As for the silicon wafers 16, an expensive wafer such as a polished wafer is not necessarily used. A chemical etched wafer and so on satisfies the requirements. Further, as to surface conditions of a wafer, a level similar to that of an as-sliced wafer satisfies the requirements as long as surface cleanliness has no problem. Such wafers are available at lower cost.

The materials are charged into the quartz crucible 5. Then, Ar gas is introduced from a gas inlet 10 set in a pulling chamber 2, while air is exhausted from a gas outlet 9 by running a vacuum pump (not shown). In this way, the internal atmosphere is replaced with Ar atmosphere.

Next, the heater 7 surrounding the graphite crucible 6 heats and melts the materials to obtain the material melt 4. At this moment, an organic compound 17 adheres to the silicon wafers 16 at the time of being melted. Or, when the organic compound 17 evaporates, the compound 17 is certainly caught by the silicon wafers 16. Then, the silicon wafers 16 are melted, and elements of the organic compound 17 are also melted into the melt 4. Thus the melt 4 is doped with carbon. When the carbon powder 18 is used, sandwiching the powder 18 between the silicon wafers 16 prevents Ar gas from scattering the powder 18 during melting. And the powder 18 is melted into the material melt 4. In this manner, because carbon is kept from scattering at the time of melting, it becomes possible to control carbon concentration in the material melt 4 to be a desired concentration.

After the materials are melted, a seed crystal 13 is immersed into the material melt 4. Then the seed crystal 13 is pulled upwardly with being rotated to grow a rod-like silicon single crystal 3. Thus a carbon-doped silicon single crystal with a desired carbon concentration is produced.

In another embodiment of the present invention, an organic compound such as polyethylene or vinyl polymer is processed into a bag. Then carbon powder is contained in the bag to prepare a carbon dopant. Together with polycrystalline silicon and a dopant controlling resistivity, the carbon dopant is charged into a quartz crucible. Then the materials are melted and a crystal is grown as is the case with above. Thus a carbon-doped silicon single crystal with a desired carbon concentration is produced. In this case, a bag made of an organic compound containing carbon powder may be charged into a quartz crucible also with sandwiching the bag between silicon wafers. Use of such a method prevents the carbon powder and so on from scattering more certainly.

The method for producing a silicon single crystal with carbon-doping by using an organic compound consisting of carbon and hydrogen, or carbon and hydrogen and oxygen such as polyethylene or vinyl polymer was explained above. And, the present invention may use an organic compound including carbon and nitrogen as main elements such as nylon. In this case, together with carbon, nitrogen is melted into a material melt at the time of melting material. As a result of this, pulling a crystal from such a material melt provides a carbon- and also nitrogen-doped silicon single crystal. Consequently, use of such a method enables easy carbon- and nitrogen-doping, and a carbon- and nitrogen-doped silicon single crystal with high purity can be produced at low cost.

Example 1

Into a quartz crucible with a diameter of 18 inches (450 mm), polyethylene which was sandwiched between two chemical-etched silicon wafers, 70 kg of a polycrystalline silicon material, and boron dopant for controlling resistivity were charged. The amount of the polyethylene was adjusted so that carbon concentration of a silicon single crystal at 100 cm from the top of the straight body would be $3 \times 10^{16}$ (atoms/cc New ASTM). After the materials were melted, a carbon-doped P-type silicon single crystal with a diameter of 150 mm and with a straight body length of 100 cm was grown. Five silicon single crystals like this were produced. Wafer-shaped samples were sliced from the crystals at 100 cm from the top of the straight body, respectively. Carbon concentration and lifetime of the samples were measured.

As a result, as shown in Table 1, average of carbon concentration was $3.06 \times 10^{16}$ (atoms/cc New ASTM), and the standard deviation σ thereof was 0.20. The average value of lifetime was 582 (μsec) and the standard deviation σ thereof was 38.

TABLE 1

| | Example 1 | Example 2 | Comparative Example |
|---|---|---|---|
| Average Value of Carbon Concentration ($\times 10^{16}$ atoms/cc New ASTM) | 3.06 | 3.01 | 2.82 |
| σ | 0.20 | 0.12 | 0.32 |
| Average Value of Lifetime (μsec) | 582 | 580 | 560 |
| σ | 38 | 45 | 44 |

Example 2

Five P-type silicon single crystals were produced with the same conditions as Example 1, except charging high purity carbon powder sandwiched between two chemical etched silicon wafers as a carbon dopant into a quartz crucible. As for the high purity carbon powder, carbon powder with purity of greater than 99.99%, with ash content of less than 0.01%, and with a particle diameter of 1 to 100 μm was used. Wafer-shaped samples were sliced from the silicon single crystals at 100 cm from the top of the straight body, respectively. Carbon concentration and lifetime of the samples were measured.

As a result, as shown in Table 1, average of carbon concentration was $3.01 \times 10^{16}$ (atoms/cc New ASTM), and a standard deviation σ thereof was 0.12. The average value of lifetime was 580 (μsec) and the standard deviation σ thereof was 45.

Comparative Example 1

Five P-type silicon single crystals were produced with the same conditions as Example 1 and Example 2, except charging the same high purity carbon powder as Example 2 directly without being sandwiched between wafers, together with a polycrystalline silicon material, into a quartz crucible. Wafer-shaped samples were sliced from the silicon single crystals at 100 cm from the top of the straight body, respectively. Carbon concentration and lifetime of the samples were measured.

As a result, as shown in Table 1, average of carbon concentration was $2.82 \times 10^{16}$ (atoms/cc New ASTM), and a standard deviation σ thereof was 0.32. The average value of lifetime was 560 (μsec) and the standard deviation σ thereof was 44.

Example 1 and 2 achieved the carbon concentrations almost the same as the target value. Moreover, deviations of carbon concentrations among five samples were small. On the other hand, in Comparative Example 1, the average value of carbon concentrations of five samples was less than those of Examples, and the deviation was larger than those of Examples. In addition, in Comparative Example, there were many dislocations of the crystals, and it took more time to produce a silicon single crystal by about 30% on average than Examples.

Consequently, it has been confirmed that the production method according to the present invention provides a silicon single crystal with a desired carbon concentration and with stability.

Example 3

Into a quartz crucible with a diameter of 32 inches (800 mm), 360 kg of a polycrystalline silicon material, and the same high purity carbon powder as Example 2 with sandwiching the powder between chemical etched wafers, were charged into the quartz crucible. At this time, the amount of the carbon powder was adjusted so that carbon concentration in silicon at 140 cm from the top of the straight body would be $6\times10^{16}$ (atoms/cc New ASTM). In addition, boron dopant for controlling resistivity was charged, and the materials were heated and melted with a heater. Then a P-type silicon single crystal with a diameter of 300 mm and with a straight body length of 140 cm was grown with applying horizontal magnetic field at a central magnetic field intensity of 3000 G by the MCZ (Magnetic field applied czochralski) method. After that, a wafer-shaped sample was sliced from the crystal at 140 cm from the top of the straight body. Carbon concentration of the sample was measured, and it was $6\times10^{16}$ (atoms/cc New ASTM).

Consequently, use of the production method according to the present invention enables control of carbon concentration to achieve a desired concentration regardless of a diameter of a crystal to be pulled, or the presence or absence of application of magnetic field.

Example 4

A P-type silicon single crystal with a diameter of 150 mm and with a straight body length of 100 cm was produced with the same conditions as Example 1, except charging nylon sandwiched between two chemical etched silicon wafers as a carbon dopant into a quartz crucible. After that, a wafer-shaped sample was sliced from the crystal at 100 cm from the top of the straight body. Carbon concentration of the sample was measured, and it was $3\times10^{16}$ (atoms/cc New ASTM). As mentioned above, by using nylon including carbon and nitrogen as main elements, a carbon- and nitrogen-doped silicon single crystal was produced.

By the way, examples of charging an organic compound or carbon powder with being sandwiched between silicon wafers into a quartz crucible were explained. And, when only an organic compound or a bag made of an organic compound containing carbon powder is charged into a quartz crucible, carbon-doped silicon single crystals were produced with stability as with the above cases.

The present invention is not limited to the embodiments described above. The above-described embodiments are mere examples, and those having substantially the same structure as technical ideas described in the appended claims and providing the similar functions and advantages are included in the scope of the present invention. For example, the present invention is applicable regardless of crystal orientation, conductivity type, resistivity and so on of a silicon single crystal to be produced.

The invention claimed is:

1. A method for producing a silicon single crystal by the Czochralski method with carbon-doping comprising: charging a polycrystalline silicon material and any one of a carbon dopant selected from the group consisting of an organic compound, carbon powder and a combination of an organic compound and carbon powder into a crucible, the carbon dopant being sandwiched between a plurality of silicon wafers, and melting the polycrystalline silicon material and the carbon dopant; and then growing a silicon single crystal from the melt of the polycrystalline silicon material and the carbon dopant.

2. The method for producing a silicon single crystal with carbon-doping according to claim 1, wherein the carbon dopant is the combination of the organic compound and the carbon powder, and the carbon powder is contained in a bag made of the organic compound.

3. The method for producing a silicon single crystal with carbon-doping according to claim 1, wherein main elements of the organic compound are selected from the group consisting of a combination of carbon and hydrogen, and a combination of carbon, hydrogen and oxygen.

4. The method for producing a silicon single crystal with carbon-doping according to claim 2, wherein main elements of the organic compound are selected from the group consisting of a combination of carbon and hydrogen, and a combination of carbon, hydrogen and oxygen.

5. The method for producing a silicon single crystal with carbon-doping according to claim 1, wherein the organic compound includes carbon and nitrogen as main elements, and nitrogen is doped in addition to carbon-doping.

6. The method for producing a silicon single crystal with carbon-doping according to claim 2, wherein the organic compound includes carbon and nitrogen as main elements, and nitrogen is doped in addition to carbon-doping.

7. The method for producing a silicon single crystal with carbon-doping according to claim 3, wherein the organic compound includes carbon and nitrogen as main elements, and nitrogen is doped in addition to carbon-doping.

8. The method for producing a silicon single crystal with carbon-doping according to claim 4, wherein the organic compound includes carbon and nitrogen as main elements, and nitrogen is doped in addition to carbon-doping.

9. The method for producing a silicon single crystal with carbon-doping according to claim 1, wherein any one or more of polyethylene, vinyl polymer and nylon is/are used as the organic compound.

10. The method for producing a silicon single crystal with carbon-doping according to claim 2, wherein any one or more of polyethylene, vinyl polymer and nylon is/are used as the organic compound.

11. The method for producing a silicon single crystal with carbon-doping according to claim 3, wherein any one or more of polyethylene, vinyl polymer and nylon is/are used as the organic compound.

12. The method for producing a silicon single crystal with carbon-doping according to claim 4, wherein any one or more of polyethylene, vinyl polymer and nylon is/are used as the organic compound.

13. The method for producing a silicon single crystal with carbon-doping according to claim 5, wherein any one or more of polyethylene, vinyl polymer and nylon is/are used as the organic compound.

14. The method for producing a silicon single crystal with carbon-doping according to claim 6, wherein any one or more of polyethylene, vinyl polymer and nylon is/are used as the organic compound.

15. The method for producing a silicon single crystal with carbon-doping according to claim 7, wherein any one or more of polyethylene, vinyl polymer and nylon is/are used as the organic compound.

16. The method for producing a silicon single crystal with carbon-doping according to claim 8, wherein any one or more of polyethylene, vinyl polymer and nylon is/are used as the organic compound.

* * * * *